(12) United States Patent
Bolandrina et al.

(10) Patent No.: US 12,300,305 B2
(45) Date of Patent: *May 13, 2025

(54) PARALLEL ACCESS IN A MEMORY ARRAY

(71) Applicant: Micron Technology, Inc., Boise, ID (US)

(72) Inventors: Efrem Bolandrina, Fiorano al Serio (IT); Andrea Martinelli, Bergamo (IT); Christophe Vincent Antoine Laurent, Agrate Brianza (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,185

(22) Filed: Feb. 20, 2024

(65) Prior Publication Data

US 2024/0274183 A1 Aug. 15, 2024

Related U.S. Application Data

(63) Continuation of application No. 17/686,240, filed on Mar. 3, 2022, now Pat. No. 11,915,740.

(51) Int. Cl.
*G11C 8/00* (2006.01)
*G11C 11/4074* (2006.01)
(Continued)

(52) U.S. Cl.
CPC ...... *G11C 11/4082* (2013.01); *G11C 11/4074* (2013.01); *G11C 11/4085* (2013.01); *G11C 11/4091* (2013.01); *G11C 11/4093* (2013.01)

(58) Field of Classification Search
CPC ............ G11C 11/4082; G11C 11/4074; G11C 11/4085; G11C 11/4091; G11C 11/4093; G11C 13/0004; G11C 13/0026; G11C 8/10; G11C 2207/002; G11C 2207/005; G11C 8/08; G11C 7/18; G11C 7/1051;
(Continued)

(56) References Cited

U.S. PATENT DOCUMENTS 7,983,065 B2 7/2011 Samachisa
8,089,120 B2 1/2012 Tanaka et al.
(Continued)

OTHER PUBLICATIONS

Fantini et al., "Decoding Architecture for Memory Devices," filed with the USPTO on Apr. 15, 2021 (74 pages).

*Primary Examiner* — Tha-O H Bui
(74) *Attorney, Agent, or Firm* — Holland & Hart LLP

(57) ABSTRACT

Methods, systems, and devices for parallel access in a memory array are described. A set of memory cells of a memory device may be associated with an array of conductive structures, where such structures may be coupled using a set of transistors or other switching components that are activated by a first driver. The set of memory cells may be divided into two or more subsets of memory cells, where each subset may be associated with a respective second driver for driving access currents through memory cells of the subset. Two or more of such second drivers may operate concurrently, which may support distributing current or distributing associated circuit structures across a different footprint of the memory device than other different implementations with a single such second driver.

20 Claims, 8 Drawing Sheets

(51) Int. Cl.
*G11C 11/408* (2006.01)
*G11C 11/4091* (2006.01)
*G11C 11/4093* (2006.01)

(58) Field of Classification Search
CPC ........... G11C 5/02; G11C 7/06; G11C 7/1078; H10B 61/20; H10B 63/10; H10B 63/30; H10B 63/845
USPC .................................................... 365/230.01
See application file for complete search history.

(56) References Cited

U.S. PATENT DOCUMENTS

| | | | |
|---|---|---|---|
| 10,700,079 B2* | 6/2020 | Park | H01L 23/535 |
| 11,699,478 B2* | 7/2023 | Inuzuka | G11C 16/08 |
| | | | 365/185.13 |
| 2003/0003611 A1* | 1/2003 | Weiner | G01R 31/2831 |
| | | | 438/16 |
| 2010/0046267 A1* | 2/2010 | Yan | G11C 16/24 |
| | | | 365/230.03 |
| 2012/0147652 A1 | 6/2012 | Scheuerlein | |

* cited by examiner

SECTION A-A

Unselected Memory Cell 105   Selected Memory Cell 105-a

Access a memory array comprising a plurality of pillars arranged in a two-dimensional array of a first quantity of pillars along a first direction and a second quantity of pillars along a second direction, each pillar of the plurality of pillars coupled with a respective plurality of memory cells Couple each pillar of a set of pillars along the second direction with a respective sensing line ⟶ 810

Bias, with a first word line driver and during the coupling of each pillar of the set with the respective sensing line, a first word line coupled with a respective memory cell of each pillar of a first subset of the set of pillars ⟶ 815

⟶ 805

Bias, with a second word line driver and during the coupling of each pillar of the set with the respective sensing line, a second word line coupled with a respective memory cell of each pillar of a second subset of the set of pillars ⟶ 820

PARALLEL ACCESS IN A MEMORY ARRAY

CROSS REFERENCE

The present application for patent is a continuation of U.S. patent application Ser. No. 17/686,240 by Bolandrina et al., entitled "PARALLEL ACCESS IN A MEMORY ARRAY," filed Mar. 3, 2022, assigned to the assignee hereof, and is expressly incorporated by reference in its entirety herein.

FIELD OF TECHNOLOGY

The following relates to one or more systems for memory, including parallel access in a memory array.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 8 shows a flowchart illustrating a method or methods that support parallel access in a memory array in accordance with examples as disclosed herein.

DETAILED DESCRIPTION

Figure 1:
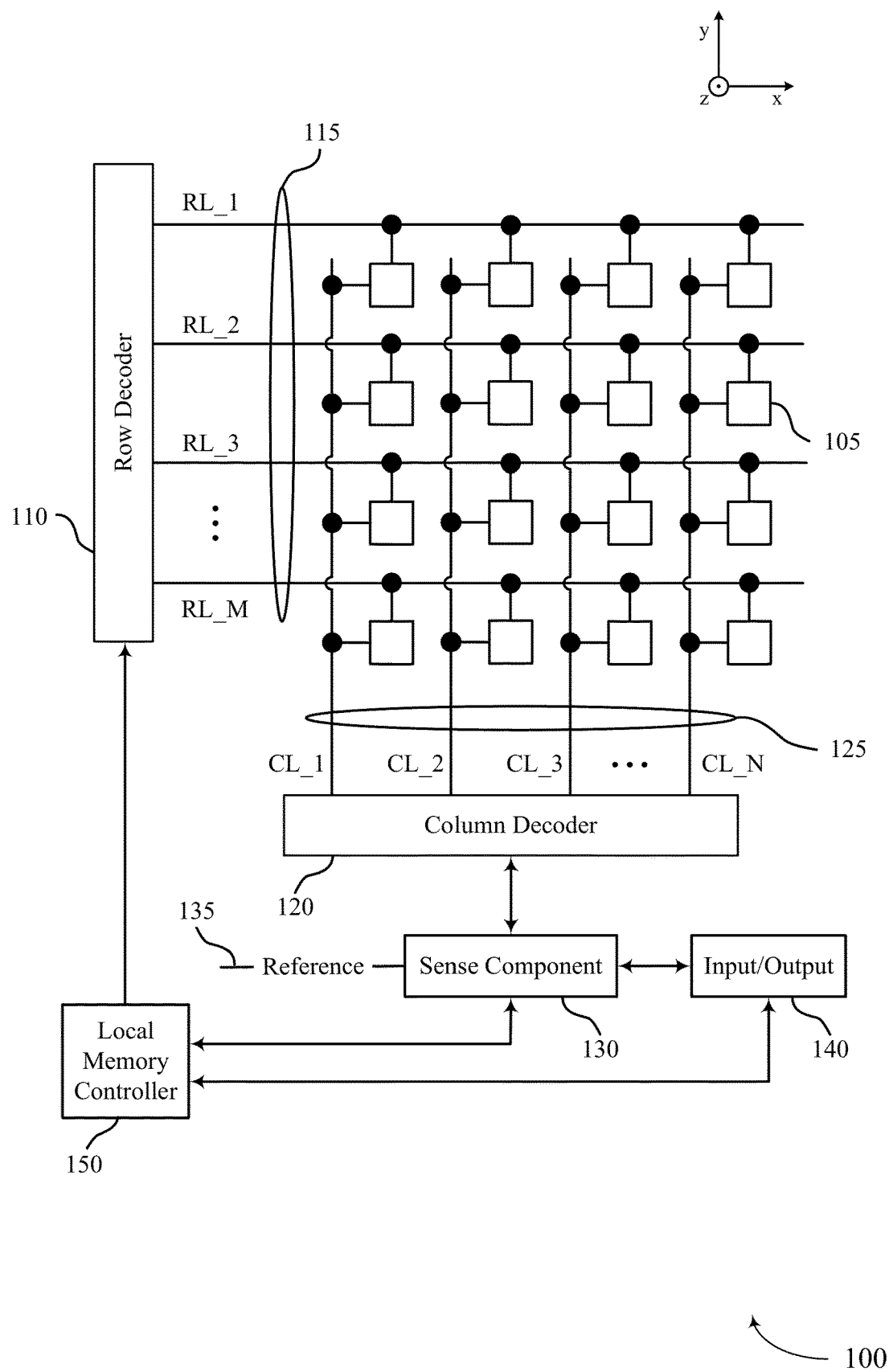
FIG. 1 illustrates an example of a memory array that supports parallel access in a memory array in accordance with examples as disclosed herein.

In some memory architectures, a memory cell may be accessed (e.g., written to, read from) based on an electrical current through the memory cell. For example, in some material memory architectures (e.g., memory architectures implementing one or more chalcogenide memory elements), a logic state may be written to a memory cell based on a current driven through the memory cell (e.g., an amount of current, a direction of current), and a logic state may be read from the memory cell based on a current (e.g., a presence of current, an absence of current, an amount of current) through the memory cell based on or in response to a read bias across the memory cell. In some such architectures, memory cells may be accessed based on various decoding procedures or architectures, which may involve transistors or other switching components to access selected memory cells in accordance with an addressing scheme. For example, for accessing certain memory cells, a voltage may be applied to gates of some transistors for coupling some conductive structures (e.g., for coupling access lines across a channel of the transistors), and the voltage may not be applied to gates of some other transistors to maintain an isolation between other conductive structures.

For a given set of memory cells (e.g., a section of memory cells, a tile of memory cells), a driver associated with driving access currents through the memory cells may be associated with a relatively higher current than a driver associated with coupling conductive structures (e.g., a driver associated with biasing transistor gates, a driver associated with activating transistor channels) in accordance with an addressing scheme of the set of memory cells. In some examples, a driver associated with a relatively higher current may be associated with a relatively larger footprint of a memory die, or a relatively higher current density through interconnecting structures such as socket regions, or both a relatively larger footprint and a relatively higher current density, among other differences compared with a driver associated with a relatively lower current. In some examples, differences between drivers associated with different current levels for a same set of memory cells may lead to implementation challenges in a memory device.

In accordance with examples as disclosed herein, drivers associated with different current levels for a set of memory cells may be configured to facilitate various aspects of a layout of or an operation of a memory device. For example, a set of memory cells of a memory device may be associated with an array of conductive structures, where such structures (e.g., along a direction of the array) may be coupled using a set of transistors or other switching components that are activated by a first driver (e.g., a selection driver, a gate driver). The set of memory cells may be divided into two or more subsets of memory cells (e.g., with different subsets arranged along the direction of the array), where each subset may be associated with a respective second driver (e.g., a read driver, a write driver, a memory cell current driver) for driving access currents through memory cells of the subset. In some examples, two or more of such second drivers may operate concurrently (e.g., supporting aspects of parallel access of multiple subsets of memory cells), which may support distributing circuit structures or distributing current across a different (e.g., larger) footprint of the memory device than other different implementations with a single such second driver. By configuring sets of memory cells associated with multiple second drivers for each first driver in accordance with examples as disclosed herein, a memory device may be implemented with improved layout density, improved addressing flexibility, reduced or otherwise improved current magnitude or current density through conductive structures, reduced path length between memory cells and sensing circuitry, or reduced charge leakage or other power consumption, or any combination thereof, among other benefits.

Features of the disclosure are initially described in the context of memory devices and arrays with reference to FIGS. 1, 2, 3A, and 3B. Features of the disclosure are described in the context of example layouts with reference to FIGS. 4-6. These and other features of the disclosure are further illustrated by and described with reference to an apparatus diagram and flowcharts that relate to parallel access in a memory array as described with reference to FIGS. 7 and 8.

FIG. 1 illustrates an example of a memory device 100 that supports parallel access in a memory array in accordance with examples as disclosed herein. In some examples, the memory device 100 may be referred to as or include a memory die, a memory chip, or an electronic memory apparatus. The memory device 100 may be operable to provide physical memory locations (e.g., addresses) that may be used or referenced by a system (e.g., a host device coupled with the memory device 100).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting memory cell may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some examples of the memory device 100, a memory cell 105 may be accessed (e.g., written to, read from) based on an electrical current through the memory cell 105. For example, a logic state may be written to a memory cell 105 based on a current driven through the memory cell 105 (e.g., an amount of current, a direction of current), and a logic state may be read from the memory cell 105 based on a current (e.g., a presence of current, an absence of current, an amount of current) through the memory cell 105 in response to a read bias across the memory cell 105. In some examples, memory cells 105 may be accessed based on various decoding architectures, which may implement transistors or other switching components (e.g., of a row decoder 110, of a column decoder 120) to access selected memory cells 105 in accordance with an addressing scheme. For example, for accessing certain memory cells 105, a voltage may be applied to gates of some transistors for coupling some conductive structures (e.g., for coupling access lines across a channel of the transistors), and the voltage may not be applied to gates of other transistors to maintain an isolation between other conductive structures.

For a given set of memory cells 105 (e.g., a section of memory cells, a tile of memory cells), a driver associated with driving access currents through the memory cells 105 may be associated with a relatively higher current than a driver associated with coupling conductive structures (e.g., a driver associated with biasing transistor gates, a driver associated with activating transistor channels, a driver associated with a row decoder, a driver associated with a column decoder) in accordance with an addressing scheme of the set of memory cells 105. In some examples, a driver associated with a relatively higher current may be associated with a relatively larger footprint of a memory die, or a relatively higher current density through interconnecting structures such as socket regions, among other differences compared with a driver associated with a relatively lower current. In some examples, differences between drivers associated with different current levels for a same set of memory cells 105 may lead to implementation challenges in a memory device 100.

In accordance with examples as disclosed herein, drivers associated with different current levels for a set of memory cells 105 may be configured to facilitate various aspects of layout or operation of a memory device 100. For example, a set of memory cells 105 of a memory device 100 may be associated with an array of conductive structures, where such structures (e.g., along a direction of the array) may be coupled using a set of transistors or other switching components that are activated by a first driver (e.g., a selection driver, a gate driver, a driver associated with a row decoder 110, a driver associated with a column decoder 120). The set of memory cells 105 may be divided into two or more subsets of memory cells 105 (e.g., with different subsets arranged along the direction of the array), where each subset may be associated with a respective second driver (e.g., a read driver, a write driver, a memory cell current driver) for driving access currents through memory cells 105 of the subset. In some examples, two or more of such second drivers may operate concurrently, which may support distributing circuit structures or distributing current across a different footprint of the memory device 100 (e.g., a larger footprint of a memory die, a larger footprint of a substrate) than other different implementations with a single such second driver. By configuring sets of memory cells 105 associated with multiple second drivers for each first driver in accordance with examples as disclosed herein, a memory device 100 may be implemented with improved layout density, improved addressing flexibility, reduced or otherwise improved current magnitude or current density through conductive structures, reduced path length between memory cells and sensing circuitry, or reduced charge leakage or other power consumption, among other benefits.

The memory device 100 may include any quantity of non-transitory computer readable media that support parallel access in a memory array. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
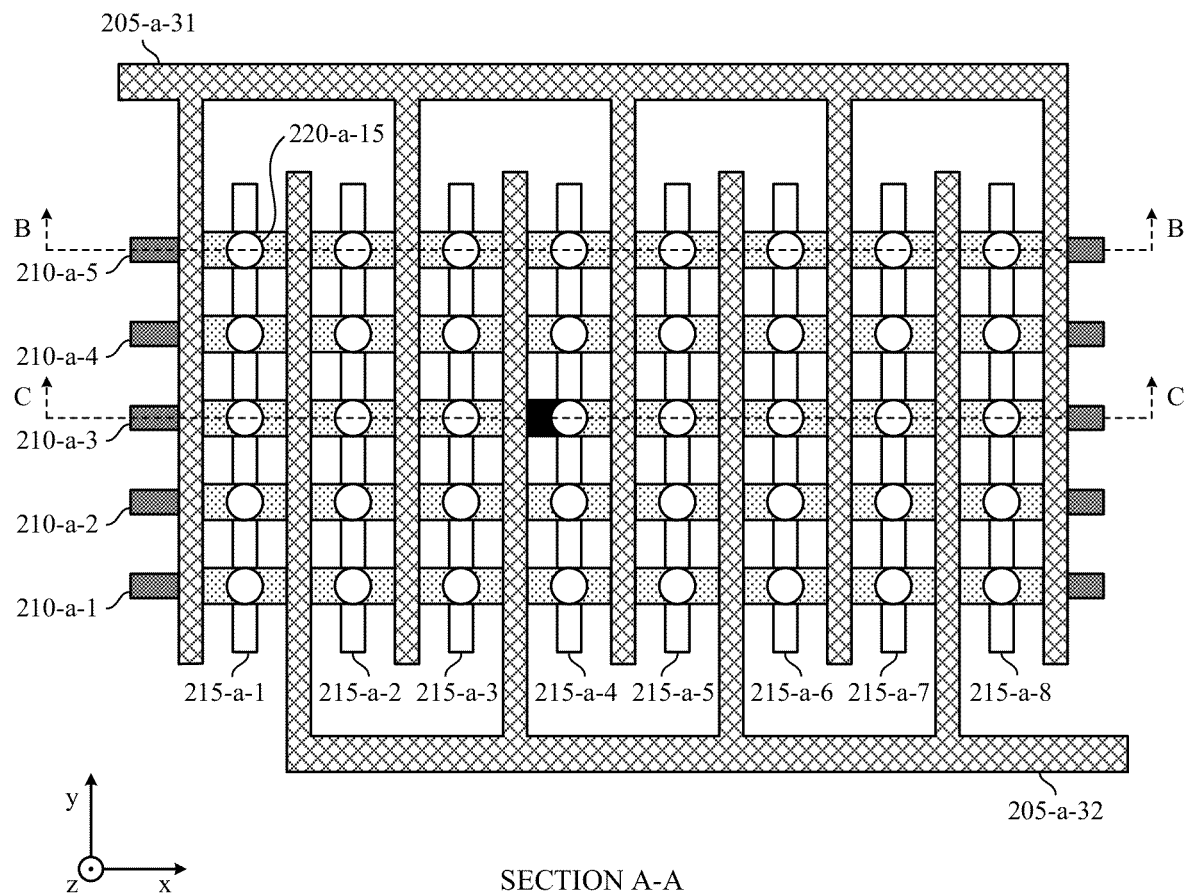
FIG. 2 illustrates a top view of an example of a memory array that supports parallel access in a memory array in accordance with examples as disclosed herein.
Figure 3A:
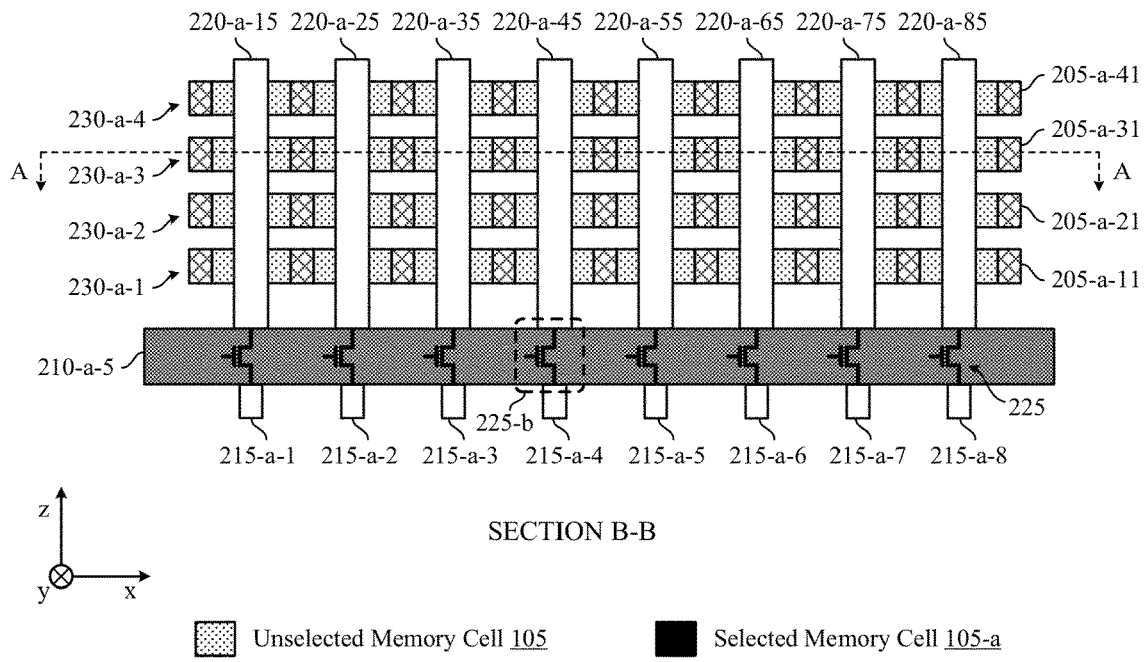
FIGS. 3A and 3B illustrate side views of an example of a memory array that supports parallel access in a memory array in accordance with examples as disclosed herein.
Figure 3B:
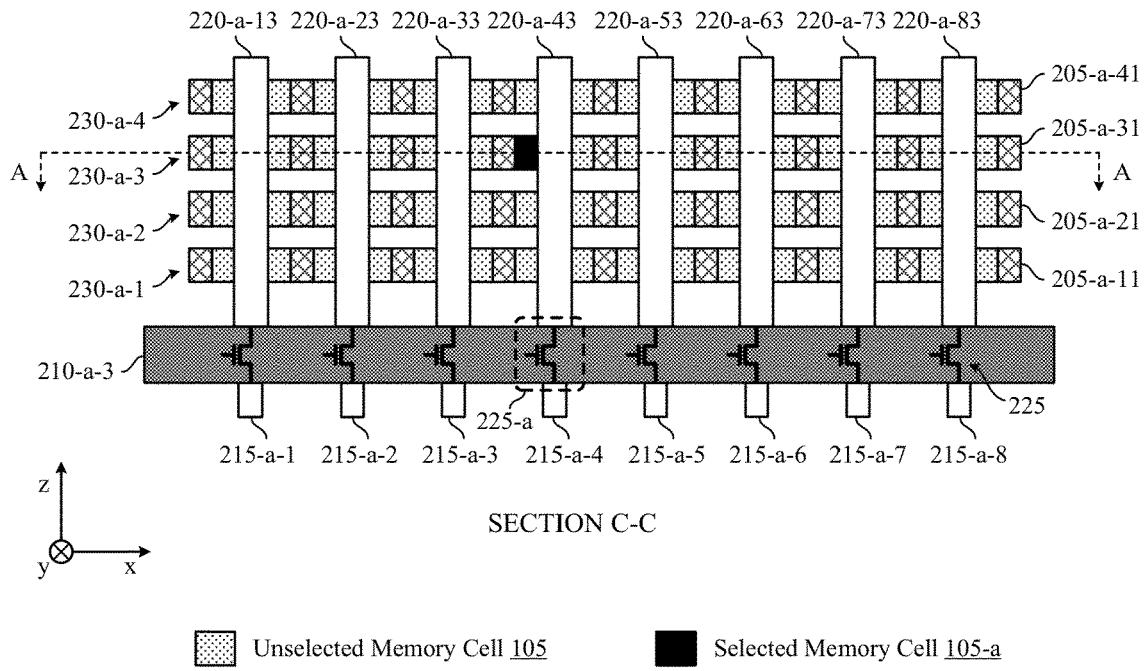

FIGS. 2, 3A, and 3B illustrate an example of a memory array 200 that supports parallel access in a memory array in accordance with examples as disclosed herein. The memory array 200 may be included in a memory device 100, and illustrates an example of a three dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-*a*, a corresponding access bias (e.g., the first voltage) may be applied to the word line 205-*a*-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-*a*-43, the sense line 215-*a*-4 may be biased with the access bias, and the gate line 210-*a*-3 may be grounded (e.g., biased to 0V) or otherwise biased with an activation voltage. In an example where the transistors 225 are n-type transistors, the gate line 210-*a*-3 being biased with a voltage that is relatively higher than the sense line 215-*a*-4 may activate the transistor 225-*a* (e.g., cause the transistor 225-*a* to operate in a conducting state), thereby coupling the pillar 220-*a*-43 with the sense line 215-*a*-4 and biasing the pillar 220-*a*-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-*a* is activated, or may be coupled with another voltage source (e.g., grounded, via a high-resistance path, via a leakage path, along an end of the pillars 220 opposite from the transistors 225) to avoid a voltage drift of the pillars 220. For example, a ground voltage being applied to the gate line 210-*a*-3 may not activate other transistors coupled with the gate line 210-*a*-3, because the ground voltage of the gate line 210-*a*-3 may not be greater than the voltage of the other sense lines 215 (e.g., which may be biased with a ground voltage or may be floating). Further, other unselected gate lines 210, including gate line 210-*a*-5 as shown in FIG. 3A, may be biased with a voltage equal to or similar to an access bias (e.g., $-V_{read}/2$, or some other negative bias or bias relatively near the access bias voltage), such that none of the transistors 225 along an unselected gate line 210 are activated. Thus, the transistor 225-*b* coupled with the gate line 210-*a*-5 may be deactivated (e.g., operating in a non-conductive state), thereby isolating the voltage of the sense line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

For a given set of memory cells 105 associated with the memory array 200 (e.g., a section of memory cells, a tile of memory cells), a driver associated with driving access currents through the memory cells 105 (e.g., a driver coupled with the word lines 205, a word line driver, a driver coupled with sense lines 215) may be associated with a relatively higher current than a driver associated with coupling conductive structures (e.g., a driver associated with activating transistors 225, a gate line driver) in accordance with an addressing scheme of the memory array 200. In some examples, a driver associated with a relatively higher current may be associated with a relatively larger footprint of the memory array 200 (e.g., along the x-direction, along the y-direction), or a relatively higher current density through interconnecting structures such as socket regions, among other differences compared with a driver associated with a relatively lower current. In some examples, differences between drivers associated with different current levels for the memory array 200 may lead to implementation challenges for the memory array 200.

In accordance with examples as disclosed herein, drivers associated with different current levels of the memory array 200 may be configured to facilitate various aspects of layout or operation. For example, the memory array 200 may be associated with an array of conductive structures (e.g., pillars 220, sense lines 215, word lines 205), where such structures (e.g., along the y-direction) may be coupled using transistors 225 that are activated by a first driver (e.g., a selection driver, a gate driver). The memory cells 105 may be divided into two or more subsets (e.g., different subsets arranged or divided along the y-direction), where each subset may be associated with a respective second driver (e.g., a read driver, a write driver, a memory cell current driver, a word line driver) for driving access currents through memory cells 105 of the subset. In some examples, two or more of such second drivers may operate concurrently (e.g., supporting aspects of parallel word line access), which may support distributing circuit structures or distributing current across a different (e.g., larger) footprint of the memory array 200 than implementations with a single such second driver. By configuring the memory array 200 to operate with multiple second drivers for each first driver in accordance with examples as disclosed herein, a memory device 100 that includes the memory array 200 may be implemented with improved layout density, improved addressing flexibility, reduced or otherwise improved current magnitude or current density through conductive structures, reduced path length between memory cells and sensing circuitry, or reduced charge leakage or other power consumption, among other benefits.

Figure 4:
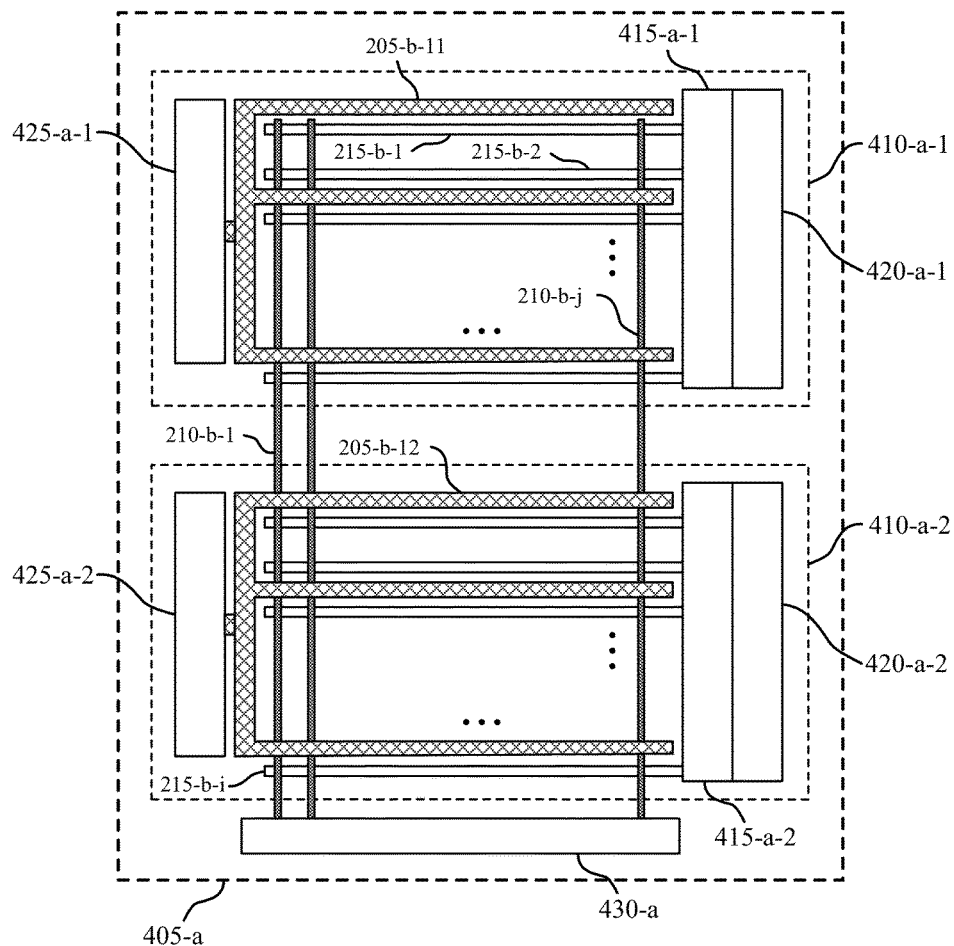
FIGS. 4 through 6 illustrate examples of layouts that support parallel access in a memory array in accordance with examples as disclosed herein.

FIG. 4 illustrates an example of a layout 400 (e.g., a first two-comb layout) that supports parallel access in accordance with examples as disclosed herein. The layout 400 may be an example for implementing aspects of a memory array 200 described with reference to FIGS. 2, 3A, and 3B. For example, the layout 400 may include an arrangement of word lines 205-b, gate lines 210-b, and sense lines 215-b, which may be examples of the respective components described with reference to FIGS. 2, 3A, and 3B. The layout 400 may also include various arrangements of pillars 220 (e.g., a two-dimensional array of pillars 220), memory cells 105 (e.g., a three-dimensional array of memory cells 105), and transistors 225 (e.g., a two-dimensional array of transistors 225), which also may be examples of the respective components described with reference to FIGS. 2, 3A, and 3B, though such components are omitted from FIG. 4 for the sake of illustrative clarity. Aspects of the layout 400 may be described with reference to an x-direction (e.g., a row direction), a y-direction (e.g., a column direction), and a z-direction (e.g., a level direction).

The layout 400 may include a section 405-a (e.g., an array, a tile, a section of memory cells 105, a section of a memory die), which may include a plurality of subsections 410-a (e.g., subsections 410-a-1 and 410-a-2). In various examples, a memory device 100 (e.g., a memory die) may include any quantity of one or more sections 405 in accordance with the layout 400, and each section 405 may include any quantity of two or more subsections 410. Subsections 410 may each include respective subsets of components of a section 405, such as respective subsets of word lines 205, respective subsets of sense lines 215, respective subsets of pillars 220 (not shown), respective subsets of transistors 225 (not shown), or respective subsets of memory cells 105 (not shown), among other subsets of components of a section 405. For example, a section 405 may include a two dimensional array of pillars 220, including a first quantity of pillars 220 (e.g., j pillars) along the y-direction and a second quantity of pillars 220 (e.g., i pillars) along the x-direction. Each subsection 410 may include a respective subset of the pillars 220, such as a two dimensional array of the first quantity of pillars 220 (e.g., j pillars) along the y-direction and a respective subset of the second quantity of pillars along the x-direction (e.g., i/2 pillars for an implementation of a section 405 having two subsections 410). The subsections 410-a may illustrate an example of subdividing the section 405-a into subsections along the x-direction. In various examples, the relative positioning of constituent features of one or more subsections 410 of a section 405 may be reversed (e.g., along the y-direction), among other differences in configuration of a section 405 in accordance with examples as disclosed herein.

The layout 400 may include a set of i sense lines 215-b (e.g., sense lines 215-b-1 through 215-b-i) along the x-direction (e.g., addressed along the x-direction, arranged along the x-direction), and each sense line 215-b may extend along the y-direction (e.g., across the section 405-a, along a column of pillars 220). The sense lines 215-b may be divided among the subsections 410-a, and sense lines 215-b of a subsection 410-a may be coupled with a respective sense amplifier array 420-a of the subsection 410-a. Sense amplifier arrays 420 may refer to sense amplifiers of a sense component 130. In some examples, a sense amplifier array 420 may include a respective sense amplifier for each sense line 215 of a subsection 410. In some other examples, a sense amplifier array 420 may include fewer sense amplifiers than sense lines 215 of a subsection 410 (e.g., fewer than i/2 sense amplifiers in the example of layout 400), and a subsection 410 may include a respective multiplexer 415 operable to couple selected ones of the sense lines 215 with sense amplifiers of the sense amplifier array 420. In an illustrative example, each of the subsections 410-a may include 64 sense lines 215-b, and each of the sense amplifier arrays 420-a may include 16 sense amplifiers, such that each multiplexer 415-a may support a 4:1 multiplexing. Additionally, or alternatively, one or more sense amplifier arrays 420 may be shared between subsections 410. For example, subsections 410-a-1 and 410-a-2 may share a single sense amplifier array 420, which may be included in a single subsection 410-a (e.g., as shown), or which may span multiple subsections 410-a.

The layout 400 may also include a set of j gate lines 210-b (e.g., gate lines 210-b-1 through 210-b-j) along the y-direction (e.g., addressed along the y-direction, arranged along the y-direction), and each gate line 210-b may extend along the x-direction (e.g., across the section 405-a, along a row of pillars 220). Each gate line 210-b may be coupled with the gates of a set of transistors 225 (e.g., i transistors 225 along the x-direction, which may correspond to i pillars 220 and i sense lines 215 along the x-direction), which may each be operable to couple a respective pillar 220 with one of the sense lines 215-b. As illustrated, each gate line 210 may extend across each subsection 410 of a section 405, and accordingly may activate transistors 225 in each of the subsections 410.

The layout 400 may also include respective sets of k word lines 205-b along the z-direction (e.g., addressed along the z-direction, arranged along the z-direction) for each subsection 410-a, and each word line 205-b may include portions extending along the y-direction between the pillars 220 of the respective subsection 410-a. For example, the subsection 410-a-1 may include a set of word lines 205-b-11 through 205-b-k1, and the subsection 410-a-2 may include a set of word lines 205-b-12 through 205-b-k2, where the illustrated word lines 205-b-11 and 205-b-12 may be associated with a same level 230 (e.g., a first level). In some examples, the illustrated word lines 205-b-11 and 205-b-12 of the layout 400 may part of sets of word lines 205 referred to as "odd" word lines with portions extending along a positive y-direction, and such word lines 205-b may be interleaved with corresponding sets of "even" word lines 205 (not shown)

with portions extending along a negative y-direction (e.g., according to alternating gaps between pillars 220).

In accordance with examples as disclosed herein, drivers associated with different current levels for the layout 400 may be configured to facilitate various aspects of layout or operation of a memory device 100 that includes the layout 400 (e.g., one or more sections 405-*a*). For example, the section 405-*a* may be associated with an array of conductive structures (e.g., word lines 205-*b*, sense lines 215-*b*, pillars 220), where such structures (e.g., along the x-direction) may be coupled using gate lines 210 that are activated by a gate line driver 430-*a*. The section 405-*a* may be divided into multiple subsections 410-*a* (e.g., two subsections 410-*a*) along the x-direction, where each subsection 410-*a* may be associated with a respective driver (e.g., a respective word line driver 425-*a*) for driving access currents through memory cells 105 of the subsection 410-*a*.

A gate line driver 430 may be coupled with each of the gate lines 210 of a section 405, and may bias one or more of the coupled gate lines 210 (e.g., with an activation bias, with a deactivation bias). Although the gate line driver 430-*a* is illustrated beside the gate lines 210-*b* (e.g., along the x-direction, which may be on a same level as the gate lines 210-*b*), a gate line driver 430 may be positioned above or below (e.g., along the z-direction) gate lines 210, word lines 205, or sense lines 215, or any combination thereof (e.g., including thin film transistors formed between access lines of a section 405 and a substrate, including transistors formed at least in part by doped portions of a semiconductor substrate, such as doped crystalline silicon). As illustrated, the gate line driver 430-*a* may bias each of the gate lines 210-*b* via a same end (e.g., an end of the gate lines 210-*b* at a relatively negative position along the x-direction). In some cases, a gate line driver 430 may be coupled with gate lines 210 via one or more conductors along the z-direction (e.g., vias, socket connections).

A gate line driver 430 may be configured to bias one or more gate lines 210 with an activation voltage. For example, an activation voltage driven by the gate line driver 430-*a* may be associated with activating a subset of transistors 225 (e.g., activating a subset of pillars 220) associated with the subsection 410-*a*-1 and a subset of transistors 225 (e.g., activating a subset of pillars 220) associated with the subsection 410-*a*-2, such as a row of transistors 225 across the section 405-*a* along the x-direction. An activation voltage for a gate line 210 may involve a relatively low current (e.g., associated with an intrinsic capacitance of an activated gate line 210-*b*, associated with a leakage from an activated gate line 210-*b* into a surrounding dielectric, associated with a gate-to-channel current through one or more transistors 225), which may be referred to as gate line consumption. In some examples, such an activation may be associated with concurrently activating transistors 225 or pillars 220 associated with multiple word lines 205-*b*, which may support accessing memory cells 105 of different subsections 410 concurrently (e.g., via multiple activated word lines 205-*b*).

Each word line driver 425 may be coupled with a subset of the word lines 205, which may form a stack of word lines 205 along the z-direction of a section 405, and a word line driver 425 may bias (e.g., individually, independently) one or more of the coupled word lines 205 from the stack (e.g., with an activation bias, with a deactivation bias, with an access bias). For example, a word line driver 425 may bias a set of one or more of the coupled word lines 205 with a first voltage (e.g., an activation bias, to drive a current through the set of memory cells 105 coupled with the one or more word lines). Concurrently with (e.g., in parallel with) the biasing with the first voltage, the word line driver 425 may bias another set of one or more others of the coupled word lines 205 with a second bias (e.g., a deactivation bias), or isolate another set of one or more others of the word lines 205 from a voltage source (e.g., set the one or more others of the word lines 205 with a floating condition), or both, among other biasing conditions. In some examples, such independent biasing may support driving an access current through memory cells 105 that are coupled with word lines 205 being biased with the first voltage and not driving an access current through memory cells 105 that are coupled with word lines 205 being biased with the second voltage or being set in the floating condition. Accordingly, under such conditions, pillars 220 and sense lines 215 each may carry current for those memory cells 105 (e.g., a single memory cell 105 being accessed) that are coupled with activated word lines and not carrying current for those memory cells that are coupled with deactivated or floating word lines 205 (e.g., those memory cells 105 that are not being accessed).

Although the word line drivers 425-*a*-1 and 425-*a*-2 are illustrated beside the word lines 205-*b* (e.g., along the y-direction, which may be on a same level as one or more word lines 205-*b*), a word line driver 425 may be positioned above or below (e.g., along the z-direction) gate lines 210, word lines 205, or sense lines 215, or any combination thereof (e.g., including thin film transistors formed between access lines of a section 405 and a substrate, including transistors formed at least in part by doped portions of a semiconductor substrate, such as doped crystalline silicon). As illustrated, the word line drivers 425-*a* may bias each of the word lines 205-*b* via a same end (e.g., an end of the word lines 205-*b* at a relatively negative position along the y-direction). In some cases, a word line driver 425 may be coupled with word lines 205 via one or more conductors along the z-direction (e.g., vias, socket connections).

A word line driver 425 may be configured to bias one or more word lines 205 with an access voltage (e.g., at least a portion of $V_{access}$, as described herein), which may be associated with accessing (e.g., writing, reading) one or more memory cells 105 coupled with the one or more word lines 205. For example, a word line driver 425 biasing word lines 205 such an access voltage may drive a current through memory cells 105 coupled with one or more pillars 220 that are activated by a gate line driver 430 (e.g., through activated channels of one or more transistors 225). In some examples, accessing the coupled memory cells 105 may involve relatively higher current than activating gate lines 210 (e.g., associated with writing a state to one or more memory cells 105, associated with reading a state from one or more memory cells 105).

In various examples, word line drivers 425 of a section 405 may be operated concurrently. For example, the word line driver 425-*a*-1 may be operable for biasing one or more word lines 205 of the subsection 410-*a*-1 (e.g., the word line 205-*b*-11) concurrently with the word line driver 425-*a*-2 biasing one or more word lines 205 of the subsection 410-*a*-2 (e.g., the word line 205-*b*-12). In some examples, two or more word line drivers 425 of a section 405 may be configured to bias word lines 205 of a same level 230 (e.g., concurrently, in accordance with a same address along the z-direction). For example, operation of the section 405-*a* may be configured for the word line driver 425-*a*-1 biasing a word line 205-*b*-m1 concurrently with the word line driver 425-*a*-2 biasing a word line 205-*b*-m2, where a value of m may correspond to a level 230 of the section 405-*a* selected by a level decoder or a word line decoder associated with the section 405-*a*. In some examples, biasing word lines 205 of a same level 230 may support improved uniformity (e.g., voltage uniformity, current uniformity) for read or write operations, or relatively simpler decoding logic or circuitry (e.g., leveraging a common decoder or decoder output for operating multiple subsections 410), among other advantages. Additionally, or alternatively, two or more word line drivers 425 of a section 405 may be configured to bias word lines 205 of different levels 230 (e.g., concurrently, in accordance with different addresses along the z-direction). For example, operation of the section 405-a may be operable for the word line driver 425-a-1 biasing a word line 205-b-m1 concurrently with the word line driver 425-a-2 biasing a word line 205-b-n2, where a values of m and n may correspond to levels 230 of the section 405-a selected by one or more level decoders or word line decoders associated with the section 405-a (e.g., where m and n may be different, or may be the same, depending on a given access scenario). In some examples, supporting the biasing of word lines 205 of different levels 230 may support improved addressing or access flexibility.

Word line drivers 425 may be implemented to support various groupings of odd and even word lines 205 in accordance with examples as disclosed herein. In some examples, a common word line driver 425 may be implemented for biasing interleaved word lines 205 (e.g., a set including both odd and even word lines 205) of a given subsection 410. For example, the section 405-a (e.g., the subsection 410-a-1) may be configured such that the word line driver 425-a-1 is operable to bias word lines 205-b-11 through 205-b-k1 (e.g., a set of odd word lines) and to bias another set of word lines 205-b of the subsection 410-a-1 that are interleaved with the word lines 205-b-11 through 205-b-k1 (e.g., a set of even word lines, not shown). In some other examples, a first word line driver 425 of a subsection 410 may be implemented for biasing odd word lines 205 of the subsection 410, and a second word line driver 425 of the subsection 410 may be implemented for biasing even word lines 205 of the subsection 410. For example, the section 405-a (e.g., the subsection 410-a-1) may be configured such that the word line driver 425-a-1 is operable to bias word lines 205-b-11 through 205-b-k1 (e.g., a set of odd word lines) and another word line driver 425-a (not shown) is operable to bias another set of word lines 205-b of the subsection 410-a-1 that are interleaved with the word lines 205-b-11 through 205-b-k1 (e.g., a set of even word lines, not shown). In some examples, such an other word line driver 425-a may be located at a position of the subsection 410-a-1 along the y-direction opposite from the word line driver 425-a-1, which may include a position beside the sense amplifier array 420-a-1 (e.g., at a relatively positive position along the y-direction). In some examples, concurrent (e.g., parallel) biasing of various combinations of word lines 205-b by one or more word line drivers 425-a may be configured in a manner that avoids multiple memory cells 105 associated with a same pillar 220 or sense line 215-b being activated (e.g., to avoid driving access current through multiple memory cells 105 along a same pillar 220 or sense line 215-b).

By configuring a section 405 with one gate line driver 430 and multiple word line drivers 425, the layout 400 illustrates an example for implementing aspects of a memory array with improved layout density (e.g., along the x-direction, the y-direction, or both), improved addressing flexibility, reduced or otherwise improved current magnitude or current density through conductive structures, reduced path length between memory cells and sensing circuitry, or reduced charge leakage or other power consumption, among other benefits, in accordance with the techniques disclosed herein.

For example, to maintain a controlled access voltage in the presence of a relatively higher current, the word line drivers 425 may individually or collectively involve a relatively larger footprint (e.g., along the x-direction, along the y-direction) than a gate line driver 430. Subdividing functionality for driving memory cell access currents between multiple word line drivers 425 for each gate line driver 430 may improve layout flexibility for the section 405. Further, by supporting the operation of multiple word line drivers 425 concurrently, currents for accessing multiple memory cells 105 of the section 405 may be distributed among a greater quantity or cross-sectional area of conductive structures, such as vias or sockets along the z-direction, or other portions of a word line 205 that may otherwise experience relatively higher current density (e.g., compared to current density for a word line 205 associated with all of the pillars 220 or memory cells 105 along the x-direction). In some examples, such a reduction in current density may support a reduction in thermal concentration (e.g., hot spots) in the section 405, which may improve reliability or efficiency for operating the section 405. In some examples, such techniques may support accessing more columns (e.g., more sense lines 215) of the section 405 for a given activated row (e.g., for a given activated gate line 210), which may support improved access performance for a given amount of gate line consumption. In some examples, such distributions may support a target parallelism using fewer sections 405.

In some examples, subdividing a section 405 into multiple subsections 410 may improve aspects of sensing states of memory cells 105, such as reducing a relative distance between memory cells 105 and sense amplifiers of a sense amplifier array 420. For example, a section 405 may be configured with access lines (e.g., collector lines), between memory cells 105 and sense amplifiers, that are oriented at least in part along the x-direction. In some examples, such access lines may be associated with a multiplexing functionality between sense lines 215 and such sense amplifiers (e.g., as part of a multiplexer 415). By subdividing a section 405 into multiple subsections 410 along the x-direction, such access lines may be relatively shorter (e.g., reduced along the x-direction by an amount proportional to a quantity of subsections 410), which may support lower leakage, lower intrinsic capacitance, or reduced sensing latency, among other benefits.

Figure 5:
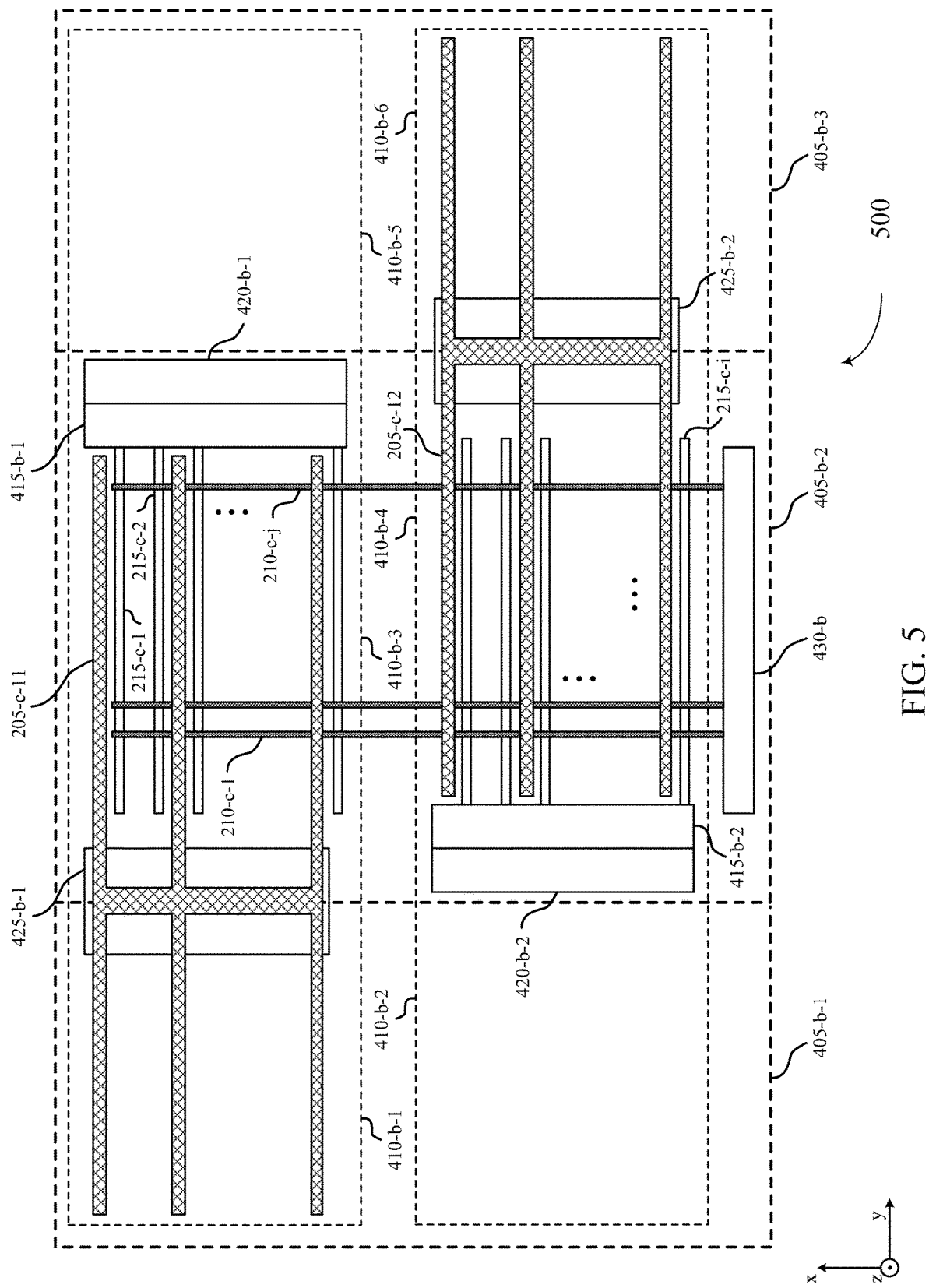

FIG. 5 illustrates an example of a layout 500 (e.g., a second two-comb layout) that supports parallel access in accordance with examples as disclosed herein. The layout 500 may be an example for implementing aspects of a memory array 200 described with reference to FIGS. 2, 3A, and 3B. For example, the layout 500 may include an arrangement of word lines 205-c, gate lines 210-c, and sense lines 215-c, which may be examples of the respective components described with reference to FIGS. 2, 3A, and 3B. The layout 500 may also include various arrangements of pillars 220, memory cells 105, and transistors 225, which also may be examples of the respective components described with reference to FIGS. 2, 3A, and 3B, though such components are omitted from FIG. 5 for the sake of illustrative clarity. Aspects of the layout 500 may be described with reference to an x-direction, a y-direction, and a z-direction.

The layout 500 may include sections 405-b, each of which may include a plurality of subsections 410-b. Each of the sections 405-b and subsections 410-b, and the constituent components, may be examples of aspects of the respective features described with reference to the layout 400. For example, the section 405-*b*-2 may include a set of i sense lines 215-*c* along the x-direction, which may be divided among the subsections 410-*b*-3 and 410-*b*-4. In various examples, the sense lines 215-*c* of a subsection 410-*b* may be coupled with a respective sense amplifier array 420-*b* of the subsection 410-*b*, with or without a respective multiplexer 415-*b*. The section 405-*b*-2 also may include a set of j gate lines 210-*c* along the y-direction, and each gate line 210-*c* may extend along the x-direction. Each gate line 210-*c* may be coupled with the gates of a row of transistors 225 (e.g., i transistors 225 along the x-direction, which may correspond to i pillars 220 and i sense lines 215 along the x-direction), which may each be operable to couple a respective pillar 220 with one of the sense lines 215-*c*. As illustrated, each gate line 210-*c* may extend across each subsection 410-*b* of the section 405-*b*-2, and accordingly may activate transistors 225 in each of the subsections 410-*b*.

In the example of layout 500, sections 405-*b* may be associated with (e.g., include a portion of) respective sets of k word lines 205-*c* along the z-direction, and each word line 205-*c* may include portions extending along the y-direction between the pillars 220 of respective subsections 410-*b* of adjacent sections 405. For example, the sections 405-*b*-1 and 405-*b*-2 may be associated with a set of word lines 205-*c*-11 through 205-*c*-k1, each of which may include portions extending along the y-direction into the subsection 410-*b*-1 of the section 405-*b*-1 and into the subsection 410-*b*-3 of the section 405-*b*-2. Each of the word lines 205-*c*-11 through 205-*c*-k1 may be an example of a word line 205 that is coupled with a respective memory cell 105 of each pillar 220 of the subsection 410-*b*-1 and coupled with a respective memory cell 105 of each pillar 220 of the subsection 410-*b*-3. Further, the sections 405-*b*-2 and 405-*b*-3 may be associated with a set of word lines 205-*c*-12 through 205-*c*-k2, each of which may include portions extending along the y-direction into the subsection 410-*b*-4 of the section 405-*b*-2 and into the subsection 410-*b*-6 of the section 405-*b*-3. Each of the word lines 205-*c*-12 through 205-*c*-k2 may be an example of a word line 205 that may be coupled with a respective memory cell 105 of each pillar 220 of the subsection 410-*b*-4 and coupled with a respective memory cell 105 of each pillar 220 of the subsection 410-*b*-6.

In some examples, the illustrated word lines 205-*c*-11 and 205-*c*-12 may be associated with a same level 230 (e.g., a first level) along the z-direction. In some examples, the illustrated word lines 205-*c* of the layout 500 may part of sets of word lines 205 referred to as "odd" word lines, and such word lines 205-*c* may be interleaved with corresponding sets of "even" word lines 205 (e.g., according to alternating gaps between pillars 220). However, such sets of word lines 205 may be arranged or operated in accordance with different configurations.

In accordance with examples as disclosed herein, drivers associated with different current levels for the layout 500 may be configured to facilitate various aspects of layout or operation of a memory device 100 that includes the layout 500 (e.g., one or more sections 405-*b*). For example, the sections 405-*b* may each be associated with respective arrays of conductive structures (e.g., word lines 205-*b*, sense lines 215-*b*, pillars 220), where such structures may be coupled using gate lines 210 that are activated by a gate line driver 430 (e.g., gate line driver 430-*b* associated with the section 405-*b*-2). Each section 405-*b* may be divided into multiple subsections 410-*b*, where each subsection 410-*b* may be associated with a respective driver (e.g., a respective word line driver 425-*b*) for driving access currents through memory cells 105 of the subsection 410-*b*.

In the example of layout 500, a gate line driver 430-*b* for a section 405-*b* may be coupled with each of the gate lines 210-*c* of the section 405-*b*. A gate line driver 430-*b* may be configured to bias one or more of the coupled gate lines 210-*c*, which may be associated with activating a row of transistors 225 across the section 405-*b* along the x-direction. As illustrated, a gate line driver 430-*b* may be operable to bias each of the gate lines 210-*c* of a section 405-*b* via a same end (e.g., at a relatively negative position along the x-direction). In some examples, such an activation may be associated with concurrently activating transistors 225 or pillars 220 associated with multiple word lines 205-*c*, which may support accessing memory cells 105 of different subsections 410-*b* concurrently (e.g., via multiple activated word lines 205-*c*).

In the example of layout 500, each word line driver 425-*b* may be coupled with word lines 205-*c* that are associated with multiple sections 405-*b* (e.g., word lines 205-*c* associated with multiple subsections 410-*b*), and may be coupled with a subset of the word lines 205-*c* associated with a given section 405-*b*. Further, each word line driver 425-*b* may be associated with a cross-sectional area of multiple sections 405-*b*, which may include circuitry that is located between the illustrated access lines and a substrate. However, in other examples, such word line drivers 425-*b* may be associated with a cross-sectional area of a single section 405, associated with cross-sectional areas of more than two sections 405, or associated with circuitry located above the illustrated access lines relative to a substrate, among other configurations.

In the example of layout 500, word line drivers 425-*b* may bias word lines 205-*c* associated with a given section 405-*b* via different ends of the section 405-*b* (e.g., along the y-direction). For example, relative to the section 405-*b*-2, the word line driver 425-*b*-1 may bias word lines 205-*c*-11 through 205-*c*-k1 via an end of the section 405-*b*-2 at a relatively negative position along the y-direction, and the word line driver 425-*b*-2 may bias word lines 205-*c*-12 through 205-*c*-k2 via an end of the section 405-*b*-2 at a relatively positive position along the y-direction.

A word line driver 425-*b* may be configured to bias one or more word lines 205-*c* with an access voltage, which may be associated with accessing one or more memory cells 105 associated with one or more sections 405-*b*. For example, a word line driver 425-*b* may drive a current through memory cells 105 that are coupled with one or more pillars 220 that are activated by one or more gate line drivers 430-*b* (e.g., through activated channels of one or more transistors 225). In an illustrative example, the word line driver 425-*b*-1 may be operable to drive a current through memory cells 105 of the section 405-*b*-2 (e.g., of the subsection 410-*b*-3) when a gate line 210-*c* of the section 405-*b*-2 is activated. Additionally or alternatively (e.g., depending on whether gate lines 210-*c* of adjacent sections 405-*b* may be activated concurrently), the word line driver 425-*b*-1 may be operable to drive a current through memory cells 105 of the section 405-*b*-1 (e.g., of the subsection 410-*b*-1) when a gate line 210-*c* of the section 405-*b*-1 is activated. In various examples, word line drivers 425-*b* associated with a given a section 405-*b* may be operated concurrently, which may include various configurations or operability for biasing word lines 205-*c* of different subsections 410-*b* in accordance with a same level 230, or for biasing word lines 205-*c* of different subsections 410-*b* in accordance with different levels 230, or various combinations thereof, including techniques similar to those described with reference to the layout 400.

Word line drivers 425-*b* may be implemented to support various groupings of odd and even word lines 205-*c* in accordance with examples as disclosed herein. In some examples, a first word line driver 425-*b* may be implemented for biasing odd word lines 205-*c* associated with a subsection 410-*b*, and a second word line driver 425-*b* may be implemented for biasing even word lines 205-*c* associated with the subsection 410-*b* (e.g., where such a second word line driver 425-*b* may be located at an opposite end of the subsection 410-*b* along the y-direction from such a first word line driver 425-*b*). For example, the layout 500 may be configured such that the word line driver 425-*b*-1 is operable to bias word lines 205-*c*-11 through 205-*c*-k1 (e.g., a set of odd word lines) and another word line driver 425-*b* (not shown, which may be located in or otherwise associated with the subsections 410-*b*-3 and 410-*b*-5) is operable to bias another set of word lines 205-*b* associated with the subsections 410-*b*-3 and 410-*b*-5 that are interleaved with the word lines 205-*c*-11 through 205-*c*-k1 (e.g., interleaved within the subsection 410-*b*-3, a set of even word lines, not shown). In some other examples, a common word line driver 425-*b* may be implemented for biasing interleaved word lines 205-*c* (e.g., a set including both odd and even word lines 205-*c*) associated with a given subsection 410-*b*. In some examples, concurrent (e.g., parallel) biasing of various combinations of word lines 205-*c* by one or more word line drivers 425-*b* may be configured in a manner that avoids multiple memory cells 105 associated with a same pillar 220 or sense line 215-*c* being activated (e.g., to avoid driving access current through multiple memory cells 105 along a same pillar 220 or sense line 215-*c*).

By configuring a section 405-*b* to be associated with multiple word line drivers 425-*b* for a given gate line driver 430-*b*, the layout 500 illustrates another example for implementing aspects of a memory array with improved layout density (e.g., along the x-direction, the y-direction, or both), improved addressing flexibility, reduced or otherwise improved current magnitude or current density through conductive structures, reduced path length between memory cells and sensing circuitry, or reduced charge leakage or other power consumption, among other benefits, in accordance with the techniques disclosed herein.

Figure 6:
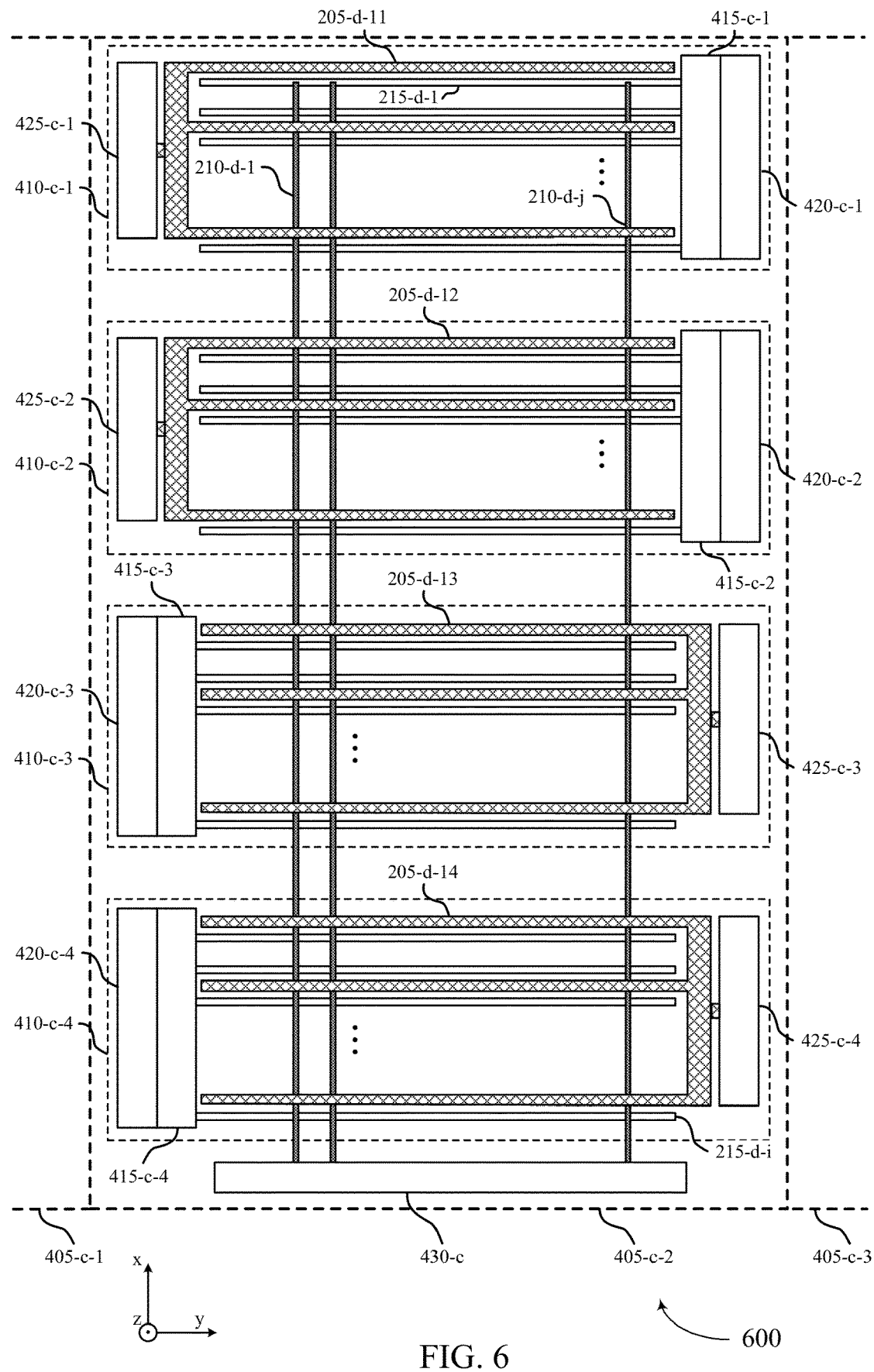

FIG. 6 illustrates an example of a layout 600 (e.g., a four-comb layout) that supports parallel access in accordance with examples as disclosed herein. The layout 600 may be an example for implementing aspects of a memory array 200 described with reference to FIGS. 2, 3A, and 3B. For example, the layout 600 may include an arrangement of word lines 205-*d*, gate lines 210-*d*, and sense lines 215-*d*, which may be examples of the respective components described with reference to FIGS. 2, 3A, and 3B. The layout 600 may also include various arrangements of pillars 220, memory cells 105, and transistors 225, which also may be examples of the respective components described with reference to FIGS. 2, 3A, and 3B, though such components are omitted from FIG. 6 for the sake of illustrative clarity. Aspects of the layout 600 may be described with reference to an x-direction, a y-direction, and a z-direction.

The layout 600 may include sections 405-*c*, each of which may include a plurality of subsections 410-*c*. Each of the sections 405-*c* and subsections 410-*c*, and the constituent components, may be examples of aspects of the respective features described with reference to the layouts 400 and 500. For example, the section 405-*c*-2 may include a set of i sense lines 215-*c* along the x-direction, which may be divided among the subsections 410-*c*-1 through 410-*c*-4. In various examples, the sense lines 215-*d* may be coupled with a respective sense amplifier array 420-*c*, with or without a respective multiplexer 415-*c*. The section 405-*c*-2 also may include a set of j gate lines 210-*d* along the y-direction, and each gate line 210-*d* may extend along the x-direction. Each gate line 210-*c* may be coupled with the gates of a row of transistors 225 (e.g., i transistors 225 along the x-direction, which may correspond to i pillars 220 and i sense lines 215 along the x-direction), which may each be operable to couple a respective pillar 220 with one of the sense lines 215-*d*.

In the example of layout 600, sections 405-*c* may be associated with (e.g., include at least a portion of) respective sets of k word lines 205-*c* along the z-direction. As illustrated, each word line 205-*c* may include portions extending between the pillars 220 of a single section 405 (e.g., like the word lines 205-*b* of the layout 400). However, in some other examples, each word line 205-*c* may include portions extending between the pillars 220 of multiple sections 405 (e.g., like the word lines 205-*c* of the layout 500, where word lines 205-*d*-11 and 205-*d*-12 may extend into sections 405-*c*-1 and 405-*c*-2 and word lines 205-*d*-13 and 205-*d*-14 may extend into sections 405-*c*-2 and 405-*c*-3). In some examples, the illustrated word lines 205-*d*-11 through 205-*d*-14 may be associated with a same level 230 (e.g., a first level) along the z-direction. In some examples, the illustrated word lines 205-*d* of the layout 500 may part of sets of word lines 205 referred to as "odd" word lines, and such word lines 205-*d* may be interleaved with corresponding sets of "even" word lines 205 (e.g., according to alternating gaps between pillars 220). However, such sets of word lines 205 may be arranged or operated in accordance with different configurations.

In accordance with examples as disclosed herein, drivers associated with different current levels for the layout 600 may be configured to facilitate various aspects of layout or operation of a memory device 100 that includes the layout 600 (e.g., one or more sections 405-*c*). For example, the sections 405-*c* may each be associated with respective arrays of conductive structures (e.g., word lines 205-*d*, sense lines 215-*d*, pillars 220), where such structures may be coupled using gate lines 210 that are activated by a gate line driver 430 (e.g., gate line driver 430-*c* associated with the section 405-*c*-2). Each section 405-*c* may be divided into multiple subsections 410-*c* (e.g., four subsections 410-*c*-1 through 410-*c*-4), where each subsection 410-*c* may be associated with a respective driver (e.g., a respective word line driver 425-*c*) for driving access currents through memory cells 105 of the subsection 410-*c*.

In the example of layout 600, word line drivers 425-*c* of a section 405-*c* may bias word lines 205-*d* via different ends of the section 405-*c* (e.g., along the y-direction). For example, the word line drivers 425-*c*-1 and 425-*c*-2 may bias word lines 205-*d* via an end of the section 405-*c*-2 at a relatively negative position along the y-direction, and the word line drivers 425-*c*-3 and 425-*c*-4 may bias word lines 205-*d* via an end of the section 405-*c*-2 at a relatively positive position along the y-direction.

Two or more word line drivers 425-*c* of a section 405-*c* may be operated concurrently, which may include various configurations or operability for biasing word lines 205-*d* of different subsections 410-*c* in accordance with a same level 230, or for biasing word lines 205-*d* of different subsections 410-*c* in accordance with different levels 230, or various combinations thereof. In some examples, operation of the section 405-*c*-2 may be configured such that the word line drivers 425-*c*-1 through 425-*c*-4 bias word lines 205-*d*-m1 through 205-*d*-m4 concurrently (e.g., in accordance with a common level addressing among subsections 410-*c*), where a value of m may correspond to a level 230 of the section 405-*c*-2 selected by a level decoder or a word line decoder associated with the section 405-*c*-2. In some other examples, operation of the section 405-*c*-2 may be operable for the word line drivers 425-*c*-1 and 425-*c*-2 biasing word lines 205-*d*-m1 and 205-*d*-m2 concurrently with the word line drivers 425-*c*-3 and 425-*c*-4 biasing word lines 205-*d*-n3 and 205-*d*-n4 (e.g., in accordance with a grouped addressing of subsections 410-*c*), where m and n may be different, or may be the same, depending on a given access scenario. In some other examples, operation of the section 405-*c*-2 may be operable for the word line drivers 425-*c*-1 through 425-*c*-4 concurrently biasing word lines 205-*d*-m1, 205-*d*-n2, 205-*d*-o3, and 205-*d*-p4 (e.g., in accordance with independent level addressing among subsections 410-*c*), where any of m, n, o, and p may be different, or may be the same, depending on a given access scenario.

By configuring a section 405-*c* to be associated with multiple word line drivers 425-*c* for a given gate line driver 430-*c*, the layout 600 illustrates another example for implementing aspects of a memory array with improved layout density (e.g., along the x-direction, the y-direction, or both), improved addressing flexibility, reduced or otherwise improved current magnitude or current density through conductive structures, reduced path length between memory cells and sensing circuitry, or reduced charge leakage or other power consumption, among other benefits, in accordance with the techniques disclosed herein.

Figure 7:
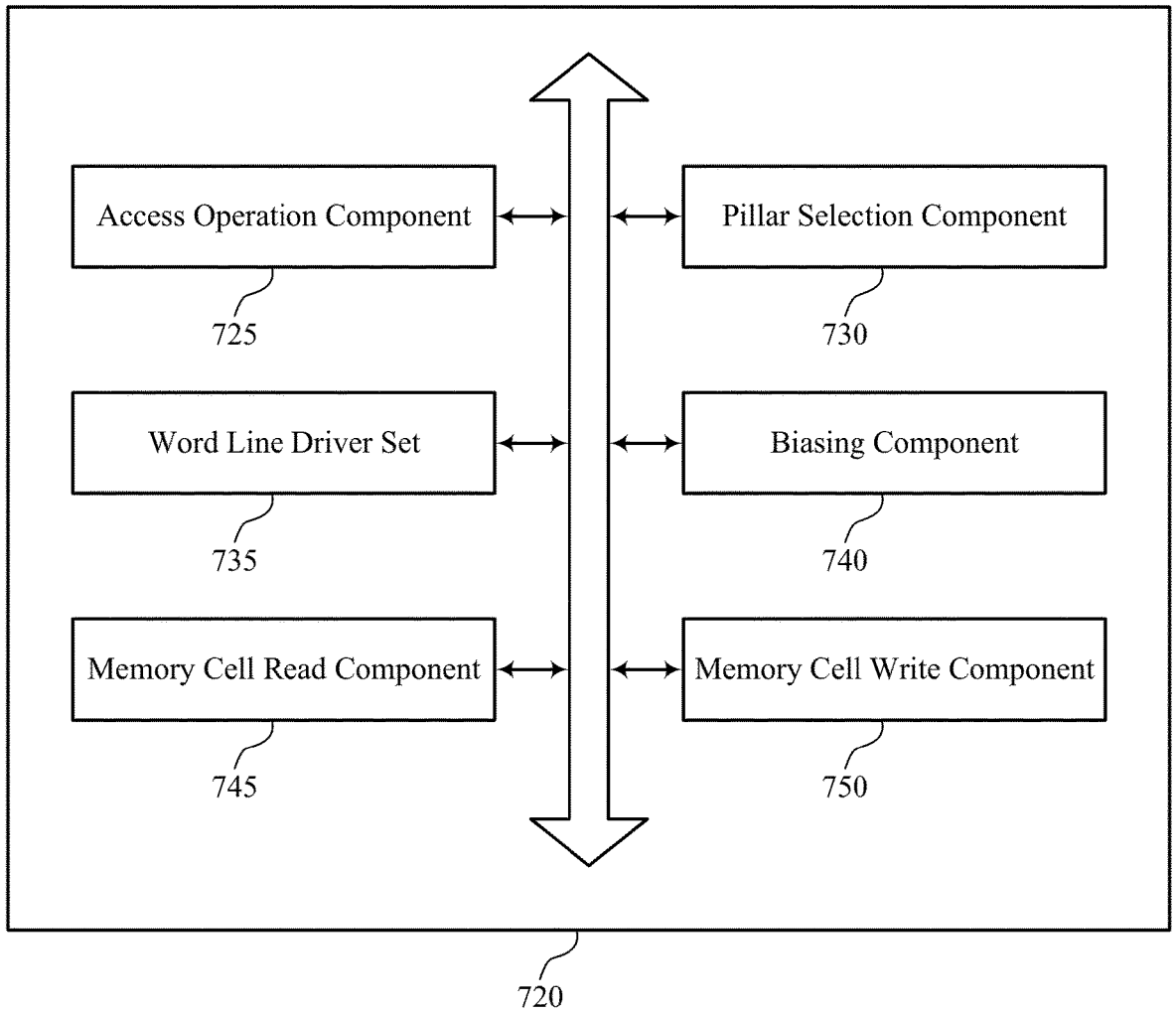
FIG. 7 shows a block diagram of a memory device that supports parallel access in a memory array in accordance with examples as disclosed herein.

FIG. 7 shows a block diagram 700 of a memory device 720 that supports parallel comb access in a memory array in accordance with examples as disclosed herein. The memory device 720 may be an example of aspects of a memory device as described with reference to FIGS. 1 through 6. The memory device 720, or various components thereof, may be an example of means for performing various aspects of parallel comb access in a memory array as described herein. For example, the memory device 720 may include an access operation component 725, a pillar selection component 730 (e.g., which may be associated with a gate line driver 430), a word line driver set 735 (e.g., which may be associated with a set of word line drivers 425), a biasing component 740 (e.g., which may be associated with a sense component 130 or a sense amplifier array 420), a memory cell read component 745, a memory cell write component 750, or any combination thereof. Each of these components may communicate, directly or indirectly, with one another (e.g., via one or more buses).

The access operation component 725 may be configured as or otherwise support a means for accessing a memory array including a plurality of pillars arranged in a two-dimensional array of a first quantity of pillars along a first direction and a second quantity of pillars along a second direction, each pillar of the plurality of pillars coupled with a respective plurality of memory cells. In some examples, each memory cell of the respective pluralities of memory cells includes a chalcogenide material.

In some examples, to support the accessing by the access operation component 725, the pillar selection component 730 may be configured as or otherwise support a means for coupling each pillar of a set of pillars along the second direction (e.g., having the second quantity of pillars) with a respective sensing line. In some examples, to support the accessing by the access operation component 725, the word line driver set 735 may be configured as or otherwise support a means for biasing, with a first word line driver of the word line driver set 735 (e.g., during the coupling of each pillar of the set with the respective sensing line by the pillar selection component 730), a first word line coupled with a respective memory cell of each pillar of a first subset of the set of pillars (e.g., the first subset associated with a third quantity of pillars along the second direction that is less than the second quantity of pillars). In some examples, to support the accessing by the access operation component 725, the word line driver set 735 may be configured as or otherwise support a means for biasing, with a second word line driver of the word line driver set 735 (e.g., during the coupling of each pillar of the set with the respective sensing line by the pillar selection component 730), a second word line coupled with a respective memory cell of each pillar of a second subset of the set of pillars (e.g., the second subset associated with the third quantity of pillars along the second direction). In some examples, biasing the first word line and biasing the second word line may be performed by the word line driver set 735 concurrently.

In some examples, the biasing component 740 may be configured as or otherwise support a means for biasing a first set of sensing lines, of a plurality of sensing lines coupled with the first subset of the set of pillars, based at least in part on coupling the first set of sensing lines with a first set of sense amplifiers. In some examples, the biasing component 740 may be configured as or otherwise support a means for biasing a second set of sensing lines, of a plurality of sensing lines coupled with the second subset of the set of pillars, based at least in part on coupling the second set of sensing lines with a second set of sense amplifiers. In some examples, the first set of sensing lines may be a subset of the plurality of sensing lines coupled with the first subset of the set of pillars, and the second set of sensing lines may be a subset of the plurality of sensing lines coupled with the second subset of the set of pillars.

In some examples, the memory cell read component 745 may be configured as or otherwise support a means for determining, for each memory cell coupled with the first word line and a respective sensing line of the first set of sensing lines, a logic state based at least in part on a current along the respective sensing line associated with the biasing of the first word line and the biasing of the first set of sensing lines. In some examples, the memory cell read component 745 may be configured as or otherwise support a means for determining, for each memory cell coupled with the second word line and a respective sensing line of the second set of sensing lines, a logic state based at least in part on a current along the respective sensing line associated with the biasing of the second word line and the biasing of the second set of sensing lines.

In some examples, the memory cell write component 750 may be configured as or otherwise support a means for writing, to each memory cell coupled with the first word line and a respective sensing line of the first set of sensing lines, a logic state based at least in part on a voltage polarity between the biasing of the first word line and the biasing of the respective sensing line. In some examples, the memory cell write component 750 may be configured as or otherwise support a means for writing, to each memory cell coupled with the second word line and a respective sensing line of the second set of sensing lines, a logic state based at least in part on a voltage polarity between the biasing of the second word line and the biasing of the respective sensing line.

In some examples, biasing the first word line may be performed via a first end of the plurality of pillars along the first direction. In some examples, biasing the second word line may be performed via a second end of the plurality of pillars along the first direction opposite from the first end. In some examples, the first word line and the second word line may be associated with a same level of the memory array above a substrate. In some examples, the first word line may be associated with a first level of the memory array above a substrate, and the second word line may be associated with a second level of the memory array above a substrate that is different than the first level.

FIG. 8 shows a flowchart illustrating a method 800 that supports parallel access in a memory array in accordance with examples as disclosed herein. The operations of method 800 may be implemented by a memory device or its components (e.g., a memory device 100, a local memory controller 150) as described herein. For example, the operations of method 800 may be performed by a memory device as described with reference to FIGS. 1 through 7. In some examples, a memory device may execute a set of instructions to control the functional elements of the device to perform the described functions. Additionally, or alternatively, the memory device may perform aspects of the described functions using special-purpose hardware.

At 805, the method may include accessing a memory array including a plurality of pillars arranged in a two-dimensional array of a first quantity of pillars along a first direction and a second quantity of pillars along a second direction. In some examples, each pillar of the plurality of pillars may be coupled with a respective plurality of memory cells. The operations of 805 may be performed in accordance with examples as disclosed herein. In some examples, aspects of the operations of 805 may be performed by an access operation component 725 as described with reference to FIG. 7. The accessing of 805 may be performed in accordance with various techniques as disclosed herein, which may include the operations of 810, 815, or 820, or any combination thereof, among other operations.

In some examples, the accessing of 805 may include (e.g., at 810) coupling each pillar of a set of pillars along the second direction (e.g., having the second quantity of pillars) with a respective sensing line. The operations of 810 may be performed in accordance with examples as disclosed herein. In some examples, aspects of the operations of 810 may be performed by a pillar selection component 730 as described with reference to FIG. 7.

In some examples, the accessing of 805 may include (e.g., at 815) biasing, with a first word line driver and during the coupling of each pillar of the set with the respective sensing line, a first word line coupled with a respective memory cell of each pillar of a first subset of the set of pillars. In some examples, the first subset may be associated with a third quantity of pillars along the second direction that is less than the second quantity of pillars. The operations of 815 may be performed in accordance with examples as disclosed herein. In some examples, aspects of the operations of 815 may be performed by a word line driver set 735 as described with reference to FIG. 7.

In some examples, the accessing of 805 may include (e.g., at 820) biasing, with a second word line driver and during the coupling of each pillar of the set with the respective sensing line, a second word line coupled with a respective memory cell of each pillar of a second subset of the set of pillars. In some examples, the second subset may be associated with the third quantity of pillars along the second direction. The operations of 820 may be performed in accordance with examples as disclosed herein. In some examples, aspects of the operations of 820 may be performed by a word line driver set 735 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for accessing a memory array including a plurality of pillars arranged in a two-dimensional array of a first quantity of pillars along a first direction and a second quantity of pillars along a second direction, each pillar of the plurality of pillars coupled with a respective plurality of memory cells, where the accessing includes; coupling each pillar of a set of pillars along the second direction (e.g., having the second quantity of pillars) with a respective sensing line; biasing, with a first word line driver and during the coupling of each pillar of the set with the respective sensing line, a first word line coupled with a respective memory cell of each pillar of a first subset of the set of pillars (e.g., the first subset associated with a third quantity of pillars along the second direction that is less than the second quantity of pillars); and biasing, with a second word line driver and during the coupling of each pillar of the set with the respective sensing line, a second word line coupled with a respective memory cell of each pillar of a second subset of the set of pillars (e.g., the second subset associated with the third quantity of pillars along the second direction).

Aspect 2: The method, apparatus, or non-transitory computer-readable medium of aspect 1, further including operations, features, circuitry, logic, means, or instructions, or any combination thereof for biasing a first set of sensing lines, of a plurality of sensing lines coupled with the first subset of the set of pillars, based at least in part on coupling the first set of sensing lines with a first set of sense amplifiers and biasing a second set of sensing lines, of a plurality of sensing lines coupled with the second subset of the set of pillars, based at least in part on coupling the second set of sensing lines with a second set of sense amplifiers.

Aspect 3: The method, apparatus, or non-transitory computer-readable medium of aspect 2 where the first set of sensing lines is a subset of the plurality of sensing lines coupled with the first subset of the set of pillars and the second set of sensing lines is a subset of the plurality of sensing lines coupled with the second subset of the set of pillars.

Aspect 4: The method, apparatus, or non-transitory computer-readable medium of any of aspects 2 through 3, further including operations, features, circuitry, logic, means, or instructions, or any combination thereof for determining, for each memory cell coupled with the first word line and a respective sensing line of the first set of sensing lines, a logic state based at least in part on a current along the respective sensing line associated with the biasing of the first word line and the biasing of the first set of sensing lines and determining, for each memory cell coupled with the second word line and a respective sensing line of the second set of sensing lines, a logic state based at least in part on a current along the respective sensing line associated with the biasing of the second word line and the biasing of the second set of sensing lines.

Aspect 5: The method, apparatus, or non-transitory computer-readable medium of any of aspects 2 through 3, further including operations, features, circuitry, logic, means, or instructions, or any combination thereof for writing, to each memory cell coupled with the first word line and a respective sensing line of the first set of sensing lines, a logic state based at least in part on a voltage polarity between the biasing of the first word line and the biasing of the respective sensing line and writing, to each memory cell coupled with the second word line and a respective sensing line of the second set of sensing lines, a logic state based at least in part on a voltage polarity between the biasing of the second word line and the biasing of the respective sensing line.

Aspect 6: The method, apparatus, or non-transitory computer-readable medium of any of aspects 1 through 5 where biasing the first word line and biasing the second word line are performed concurrently.

Aspect 7: The method, apparatus, or non-transitory computer-readable medium of any of aspects 1 through 6 where biasing the first word line is performed via a first end of the plurality of pillars along the first direction and biasing the second word line is performed via a second end of the plurality of pillars along the first direction opposite from the first end.

Aspect 8: The method, apparatus, or non-transitory computer-readable medium of any of aspects 1 through 7 where the first word line and the second word line are associated with a same level of the memory array above a substrate.

Aspect 9: The method, apparatus, or non-transitory computer-readable medium of any of aspects 1 through 7 where the first word line is associated with a first level of the memory array above a substrate and the second word line is associated with a second level of the memory array above a substrate that is different than the first level.

Aspect 10: The method, apparatus, or non-transitory computer-readable medium of any of aspects 1 through 9 where each memory cell of the respective pluralities of memory cells includes a chalcogenide material.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: An apparatus, including: a plurality of pillars arranged in a two-dimensional array of a first quantity of pillars along a first direction and a second quantity of pillars along a second direction, each pillar of the plurality of pillars coupled with a respective plurality of memory cells; a plurality of activation lines each operable to activate a respective set having the second quantity of pillars of the plurality of pillars along the second direction; a plurality of first word lines each coupled with a respective memory cell of each pillar of a first subset of the plurality of pillars, the first subset arranged in a two-dimensional array of the first quantity of pillars along the first direction and a third quantity of pillars along the second direction and less than the second quantity of pillars; a first word line driver operable to bias one of the plurality of first word lines; a plurality of second word lines each coupled with a respective memory cell of each pillar of a second subset of the plurality of pillars, the second subset arranged in a two-dimensional array of the first quantity of pillars along the first direction and the third quantity of pillars along the second direction; and a second word line driver operable to bias one of the plurality of second word lines.

Aspect 12: The apparatus of aspect 11, where: the first word line driver is operable to bias the one of the plurality of first word lines via a first end of the plurality of pillars along the first direction; and the second word line driver is operable to bias the one of the plurality of second word lines via a second end of the plurality of pillars along the first direction opposite from the first end.

Aspect 13: The apparatus of aspect 12, where: the plurality of first word lines are each coupled with a respective memory cell of each pillar of a third subset of a second plurality of pillars, different than the plurality of pillars; and the plurality of second word lines are each coupled with a respective memory cell of each pillar of a fourth subset of a third plurality of pillars, different than the plurality of pillars and the second plurality of pillars.

Aspect 14: The apparatus of any of aspects 11 through 13, further including: a plurality of third word lines each coupled with a respective memory cell of each pillar of a third subset of the plurality of pillars, the third subset arranged in a two-dimensional array of the first quantity of pillars along the first direction and the third quantity of pillars along the second direction; a third word line driver operable to bias one of the plurality of third word lines; a plurality of fourth word lines each coupled with a respective memory cell of each pillar of a fourth subset of the plurality of pillars, the fourth subset arranged in a two-dimensional array of the first quantity of pillars along the first direction and the third quantity of pillars along the second direction; and a fourth word line driver operable to bias one of the plurality of fourth word lines.

Aspect 15: The apparatus of any of aspects 11 through 14, further including: a plurality of third word lines each coupled with a respective memory cell of each pillar of the first subset of the plurality of pillars, where the second word line driver is operable to bias one of the plurality of third word lines; and a plurality of fourth word lines each coupled with a respective memory cell of each pillar of the second subset of the plurality of pillars, where the first word line driver is operable to bias one of the plurality of third word lines.

Aspect 16: The apparatus of any of aspects 11 through 15, where the first word line driver is operable for biasing the one of the plurality of first word lines concurrently with the second word line driver biasing the one of the plurality of second word lines.

Aspect 17: The apparatus of any of aspects 11 through 16, where the one of the plurality of first word lines is associated with a same address along a third direction as the one of the plurality of second word lines.

Aspect 18: The apparatus of any of aspects 11 through 17, where the first word line driver is operable for biasing the one of the plurality of first word lines at a different address along a third direction than the one of the plurality of second word lines.

Aspect 19: The apparatus of any of aspects 11 through 18, where each memory cell of the respective pluralities of memory cells includes a chalcogenide material.

Aspect 20: The apparatus of any of aspects 11 through 19, where each memory cell of the respective pluralities of memory cells is operable to store a respective logic state in accordance with a thresholding characteristic of the memory cell.

An apparatus is described. The following provides an overview of aspects of the apparatus as described herein:

Aspect 21: An apparatus, including: a memory array including a plurality of pillars arranged in a two-dimensional array of a first quantity of pillars along a first direction and a second quantity of pillars along a second direction, each pillar of the plurality of pillars coupled with a respective plurality of memory cells; a first word line driver; a second word line driver; and circuitry coupled with memory array, where, to access the memory array, the circuitry is operable to: couple each pillar of a set of pillars along the second direction, having the second quantity of pillars, with a respective sensing line; bias, with the first word line driver and during the coupling of each pillar of the set with the respective sensing line, a first word line coupled with a respective memory cell of each pillar of a first subset of the set of pillars, the first subset associated with a third quantity of pillars along the second direction that is less than the second quantity of pillars; and bias, with the second word line driver and during the coupling of each pillar of the set with the respective sensing line, a second word line coupled with a respective memory cell of each pillar of a second subset of the set of pillars, the second subset associated with the third quantity of pillars along the second direction.

Aspect 22: The apparatus of aspect 21, where, to access the memory array, the circuitry is operable to: bias a first set of sensing lines, of a plurality of sensing lines coupled with the first subset of the set of pillars, based at least in part on coupling the first set of sensing lines with a first set of sense amplifiers; and bias a second set of sensing lines, of a plurality of sensing lines coupled with the second subset of the set of pillars, based at least in part on coupling the second set of sensing lines with a second set of sense amplifiers.

Aspect 23: The apparatus of any of aspects 21 through 22, where: the first word line driver is operable to bias the first word line via a first end of the plurality of pillars along the first direction; and the second word line driver is operable to bias the second word line via a second end of the plurality of pillars along the first direction opposite from the first end.

Aspect 24: The apparatus of aspect 23, where: the first word line is coupled with a respective memory cell of each pillar of a third subset of a second plurality of pillars, different than the plurality of pillars; and the second word line is coupled with a respective memory cell of each pillar of a fourth subset of a third plurality of pillars, different than the plurality of pillars and the second plurality of pillars.

Aspect 25: The apparatus of any of aspects 21 through 24, where each memory cell of the respective pluralities of memory cells includes a chalcogenide material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
   a plurality of first pillars arranged in a first two-dimensional array, each of the plurality of first pillars coupled with a respective plurality of first memory cells;
   a plurality of second pillars arranged in a second two-dimensional array, each of the plurality of second pillars coupled with a respective plurality of second memory cells;
   a plurality of word lines each coupled with a respective first memory cell of each of the plurality of first pillars and coupled with a respective second memory cell of each of the plurality of second pillars;
   a word line driver between the plurality of first pillars and the plurality of second pillars along a first direction and operable to bias the plurality of word lines;
   a plurality of first activation lines arranged along the first direction from a first side of the word line driver, each of the plurality of first activation lines operable to activate a respective set of the plurality of first pillars along a second direction; and
   a plurality of second activation lines arranged along the first direction from a second side of the word line driver, each of the plurality of second activation lines operable to activate a respective set of the plurality of second pillars along the second direction.

2. The memory device of claim 1, further comprising:
a first gate line driver operable to bias the plurality of first activation lines, the first gate line driver located along the first direction from the first side of the word line driver; and
a second gate line driver operable to bias the plurality of second activation lines, the second gate line driver located along the first direction from the second side of the word line driver.

3. The memory device of claim 2, wherein the first gate line driver is operable for biasing one of the plurality of first activation lines concurrently with the second gate line driver biasing one of the plurality of second activation lines.

4. The memory device of claim 1, further comprising:
a plurality of first sense lines arranged along the second direction, each of the plurality of first sense lines operable to couple with a respective second set of the plurality of first pillars along the first direction based at least in part on activations of the plurality of first activation lines; and
a plurality of second sense lines arranged along the second direction, each of the plurality of second sense lines operable to couple with a respective second set of the plurality of second pillars along the first direction based at least in part on activations of the plurality of second activation lines.

5. The memory device of claim 4, wherein:
the plurality of first sense lines are operable to couple the respective second set of the plurality of first pillars with a first sense amplifier array located along the first direction from the first side of the word line driver; and
the plurality of second sense lines are operable to couple the respective second set of the plurality of second pillars with a second sense amplifier array located along the first direction from the second side of the word line driver.

6. The memory device of claim 1, further comprising:
a plurality of third pillars arranged in a third two-dimensional array, each of the plurality of third pillars coupled with a respective plurality of third memory cells;
a plurality of fourth pillars arranged in a fourth two-dimensional array, each of the plurality of fourth pillars coupled with a respective plurality of fourth memory cells;
a plurality of second word lines each coupled with a respective third memory cell of each of the plurality of third pillars and coupled with a respective fourth memory cell of each of the plurality of fourth pillars; and
a second word line driver between the plurality of third pillars and the plurality of fourth pillars along the first direction and operable to bias the plurality of second word lines,
wherein the plurality of second activation lines are arranged along the first direction from a first side of the second word line driver and are each operable to activate a respective set of the plurality of third pillars along the second direction.

7. The memory device of claim 6, wherein the plurality of second activation lines are located between the word line driver and the second word line driver along the first direction.

8. The memory device of claim 6, further comprising:
a plurality of third activation lines arranged along the first direction from a second side of the second word line driver, each of the plurality of third activation lines operable to activate a respective set of the plurality of fourth pillars along the second direction.

9. The memory device of claim 8, further comprising:
a plurality of third sense lines arranged along the second direction, each of the plurality of third sense lines operable to couple with a respective second set of the plurality of third pillars along the first direction based at least in part on activations of the plurality of second activation lines; and
a plurality of fourth sense lines arranged along the second direction, each of the plurality of fourth sense lines operable to couple with a respective second set of the plurality of fourth pillars along the first direction based at least in part on activations of the plurality of third activation lines.

10. The memory device of claim 1, wherein each first memory cell of the respective pluralities of first memory cells and each second memory cell of the respective pluralities of second memory cells comprise a chalcogenide material.

11. A method for operating a memory device, comprising:
accessing a memory array comprising a plurality of first pillars arranged in a first two-dimensional array, each of the plurality of first pillars coupled with a respective plurality of first memory cells, and a plurality of second pillars arranged in a second two-dimensional array, each of the plurality of second pillars coupled with a respective plurality of second memory cells, wherein the accessing comprises:
coupling each first pillar, of a set of the plurality of first pillars arranged along a first direction, with a respective first sensing line of a set of first sensing lines arranged along the first direction;
coupling each second pillar, of a set of the plurality of second pillars arranged along the first direction, with a respective second sensing line of a set of second sensing lines arranged along the first direction; and
biasing, with a word line driver located between the plurality of first pillars and the plurality of second pillars along a second direction, a word line coupled with a respective first memory cell of each of the plurality of first pillars and coupled with a respective second memory cell of each of the plurality of second pillars.

12. The method of claim 11, wherein the accessing further comprises:
biasing the set of first sensing lines based at least in part on coupling the set of first sensing lines with a set of first sense amplifiers located along the second direction from a first side of the word line driver; and
biasing the set of second sensing lines based at least in part on coupling the set of second sensing lines with a set of second sense amplifiers located along the second direction from a second side of the word line driver.

13. The method of claim 12, wherein:
coupling the set of first sensing lines with the set of first sense amplifiers is based at least in part on selecting the set of first sensing lines from a plurality of first sensing lines for coupling via a first multiplexer coupled with the plurality of first sensing lines; and
coupling the set of second sensing lines with the set of second sense amplifiers is based at least in part on selecting the set of second sensing lines from a plurality of second sensing lines for coupling via a second multiplexer coupled with the plurality of second sensing lines.

14. The method of claim 12, wherein the accessing further comprises:
determining, for each first memory cell coupled with the word line and a respective first sensing line of the set of first sensing lines, a respective first logic state based at least in part on a current along the respective first sensing line associated with the biasing of the word line and the biasing of the set of first sensing lines; and
determining, for each memory cell coupled with the word line and a respective second sensing line of the set of second sensing lines, a respective second logic state based at least in part on a current along the respective second sensing line associated with the biasing of the word line and the biasing of the set of second sensing lines.

15. The method of claim 11, wherein the memory array further comprises a plurality of third pillars arranged in a third two-dimensional array, each of the plurality of third pillars coupled with a respective plurality of third memory cells, and the accessing further comprises:
coupling each third pillar, of a set of the plurality of third pillars arranged along the first direction, with a respective third sensing line of a set of third sensing lines arranged along the first direction; and
biasing, with a second word line driver, a second word line coupled with a respective third memory cell of each of the plurality of third pillars.

16. The method of claim 15, wherein coupling each second pillar with the respective second sensing line and coupling each third pillar with the respective third sensing line are based at least in part on biasing a single activation line aligned along the first direction.

17. A memory device, comprising:
a memory array comprising a plurality of first pillars arranged in a first two-dimensional array, each of the plurality of first pillars coupled with a respective plurality of first memory cells, and a plurality of second pillars arranged in a second two-dimensional array, each of the plurality of second pillars coupled with a respective plurality of second memory cells;
a word line driver located between the plurality of first pillars and the plurality of second pillars along a first direction; and
circuitry coupled with the memory array and the word line driver, wherein, to access the memory array, the circuitry is operable to:
couple each first pillar, of a set of the plurality of first pillars arranged along a second direction, with a respective first sensing line of a set of first sensing lines arranged along the second direction;
couple each second pillar, of a set of the plurality of second pillars arranged along the second direction, with a respective second sensing line of a set of second sensing lines arranged along the second direction; and
bias, with the word line driver, a word line coupled with a respective first memory cell of each of the plurality of first pillars and coupled with a respective second memory cell of each of the plurality of second pillars.

18. The memory device of claim 17, wherein, to access the memory array, the circuitry is further operable to:
bias the set of first sensing lines based at least in part on coupling the set of first sensing lines with a set of first sense amplifiers located along the second direction from a first side of the word line driver; and
bias the set of second sensing lines based at least in part on coupling the set of second sensing lines with a set of second sense amplifiers located along the second direction from a second side of the word line driver.

19. The memory device of claim 18, wherein, to access the memory array, the circuitry is further operable to:
determine, for each first memory cell coupled with the word line and a respective first sensing line of the set of first sensing lines, a respective first logic state based at least in part on a current along the respective first sensing line associated with the biasing of the word line and the biasing of the set of first sensing lines; and
determine, for each memory cell coupled with the word line and a respective second sensing line of the set of second sensing lines, a respective second logic state based at least in part on a current along the respective second sensing line associated with the biasing of the word line and the biasing of the set of second sensing lines.

20. The memory device of claim 17, wherein the memory array further comprises a plurality of third pillars arranged in a third two-dimensional array, each of the plurality of third pillars coupled with a respective plurality of third memory cells, and, to access the memory array, the circuitry is further operable to:
couple each third pillar, of a set of the plurality of third pillars arranged along the first direction, with a respective third sensing line of a set of third sensing lines arranged along the first direction; and
bias, with a second word line driver, a second word line coupled with a respective third memory cell of each of the plurality of third pillars,
wherein, to couple each second pillar with the respective second sensing line and couple each third pillar with the respective third sensing line, the circuitry is operable to bias a single activation line aligned along the first direction.

* * * * *